(12) United States Patent
Goldfarb et al.

(10) Patent No.: US 6,335,656 B1
(45) Date of Patent: Jan. 1, 2002

(54) DIRECT CONVERSION RECEIVERS AND FILTERS ADAPTED FOR USE THEREIN

(75) Inventors: Marc E. Goldfarb, Atkinson, NH (US); Wyn T. Palmer, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/410,366

(22) Filed: Sep. 30, 1999

(51) Int. Cl.[7] .............................. H03B 1/00; H04B 1/10
(52) U.S. Cl. ............................ 327/559; 327/558
(58) Field of Search .................... 327/551, 552, 327/553, 554, 555, 559; 341/143; 363/172.1

(56) References Cited

U.S. PATENT DOCUMENTS

| | | | | |
|---|---|---|---|---|
| 4,857,860 A | * | 8/1989 | Sevastopoulos | 330/107 |
| 5,241,226 A | * | 8/1993 | Rossi et al. | 327/553 |
| 5,451,904 A | * | 9/1995 | Terada et al. | 330/282 |
| 5,606,277 A | * | 2/1997 | Feliz | 327/311 |
| 5,798,670 A | * | 8/1998 | Lee | 327/559 |
| 5,805,212 A | * | 9/1998 | Fujiwara | 348/208 |

* cited by examiner

Primary Examiner—My-Trang Nu Ton

(74) Attorney, Agent, or Firm—Samuels, Gauthier & Stevens, LLP

(57) ABSTRACT

A direct conversion receiver having a homodyning section fed by a received radio frequency signal having a carrier frequency and reference signal having the carrier frequency; and a filter coupled to the monodyning section. The filter includes a plurality of serially coupled high pass filter stages. The high pass filter section acts as a DC offset correction loop that eliminates the serial effect of many amplifier sections on DC offsets arising within components, while maintaining a sufficiently low cutoff frequency to avoid adversely impacting information integrity at higher frequencies. The high pass filter sections also enable the integration of the needed capacitors, thus minimizing external components and connections. Each filter stage includes an amplifier and a low pass filter coupled in a negative feedback arrangement with the amplifier. Each low pass filter is adapted to have the cutoff frequency thereof switch from an initial high cutoff frequency to a subsequent lower cutoff frequency. A high filter stage of a direct conversion receiver is provided that includes in a low pass filter feedback section thereof a capacitor and a resistor section coupled to the capacitor. The section includes a switch for changing the resistance of the resistance section. The resistance has a first resistance value during an initial phase and a second resistance value during a subsequent phase. A switching arrangement charges the capacitor rapidly during an initial, start-up time period or after a large step change in the gain of the amplifier.

23 Claims, 3 Drawing Sheets

DIRECT CONVERSION RECEIVERS AND FILTERS ADAPTED FOR USE THEREIN

BACKGROUND OF THE INVENTION

This invention relates generally to direct conversion receivers and more particularly to filters used in such receivers to remove unwanted DC signals produced by the conversion process or generated by elemental circuit variations.

As is known in the art, a direct conversion receiver mixes a received radio frequency signal directly with the carrier frequency of such signal to thereby extract information in the received signal modulating the carrier frequency. One method used to remove unwanted DC components produced by the direct conversion mixing process is to pass the output of the mixer through a DC blocking capacitor, i.e., a high pass filter, prior to subsequent amplification. In many applications it is desired to fabricate the receiver as an integrated circuit; however, the size of the capacitor, in many applications, would be so large that its fabrication in the integrated circuit would be impractical.

As is also known in the art, one technique suggested to provide this DC blockage is to use a filter having a high gain amplifier with a low pass filter in negative feedback therewith to produce a high pass filter.

SUMMARY OF THE INVENTION

In accordance with one feature of the invention, a direct conversion receiver is provided having a homodyning section fed by: a received radio frequency signal having a carrier frequency; and, a reference signal having the carrier frequency. A high pass filter is coupled to an output of the homodyning section. The high pass filter includes an amplifier and a low pass filter coupled in a negative feedback arrangement with the amplifier. The low pass filter is adapted to have the cutoff frequency thereof switch from a high cutoff frequency, during an initial phase of operation, to a subsequent lower cutoff frequency during a normal operating phase.

The high pass filter acts as a dc offset correction loop which eliminates the serial effect of many amplifier sections on dc offsets arising within components while maintaining a sufficiently low cutoff frequency to avoid adversely impacting information integrity at higher frequencies. The plurality of high pass filter sections also enables the integration of the needed capacitors thus minimizing external components and connections.

In accordance with another feature of the invention, a high pass filter of a direct conversion receiver is provided which includes, in a low pass filter feedback section thereof: a capacitor; and, a resistor section coupled to the capacitor. The resistor section includes a switch for changing the resistance of the resistance section from a first, relatively low value, during the initial phase, to a second higher resistance during the subsequent, normal operating phase.

In accordance with another feature of the invention, a direct conversion receiver is provided having a homodyning section fed by: a received radio frequency signal having a carrier frequency; and, a reference signal having the carrier frequency. A high pass filter is coupled to an output of the homodyning section. The high pass filter includes an amplifier and a low pass filter coupled in a negative feedback arrangement with the amplifier. The low pass filter has a capacitor and a switching section for rapidly charging the capacitor during an initial, pre-charge phase.

In accordance with still another feature of the invention, a low pass filter is provided. The low pass filter includes a differential amplifier having a first pair of transistors and a second pair of transistors. Each one of the transistors has a first electrode, a second electrode and a control electrode. The control electrode is adapted to control a flow of carriers (e.g., current) between the first and second electrodes. The control electrodes of the first pair of transistors provides a first input for the differential amplifier and the control electrodes of the second pair of transistors provide a second input for the differential amplifier. A current source is coupled to the first electrodes of the first and second pair of transistors. A capacitor has a first electrode coupled to the second electrode of a first one of the transistors in the first pair of transistors and a second electrode coupled to the second electrode of a first one of the transistors in the second pair of transistors. A pair of switches is included. A first one of the switches is adapted to couple the second electrode of the second transistor in the first pair thereof to either the first electrode of the capacitor, during an initial pre-charging phase; or, to the second electrode of the capacitor during a subsequent, normal operating phase. The second one of the pair of switches is adapted to couple the second electrode of the second transistor in the second pair thereof to either the second electrode of the capacitor, during the initial pre-charging phase; or, to the first electrode of the capacitor during the subsequent normal operating phase.

In accordance with one embodiment of the invention, the first and second transistors in each of the pair thereof is adapted to pass current from the current source through the first and second electrodes thereof with different current levels.

In accordance with one embodiment of the invention, a first resistance is provided between the current source and the first electrode of the first transistor in the first pair of transistors and a second resistance is provided between the current source and the first electrode of the first transistor in the second pair of transistors.

In accordance with one embodiment of the invention, an additional switch for changing the resistance of the first and second resistances from a lower value to a higher value when the filter changes from the initial pre-charging phase to the subsequent normal operating phase.

BRIEF DESCRIPTION OF THE DRAWINGS

These and other features of the invention, as well as the invention itself, will become more readily apparent from the following detailed description when read together with the accompanying drawings, in which.

DESCRIPTION OF THE PREFERRED EMBODIMENTS

Figure 1:
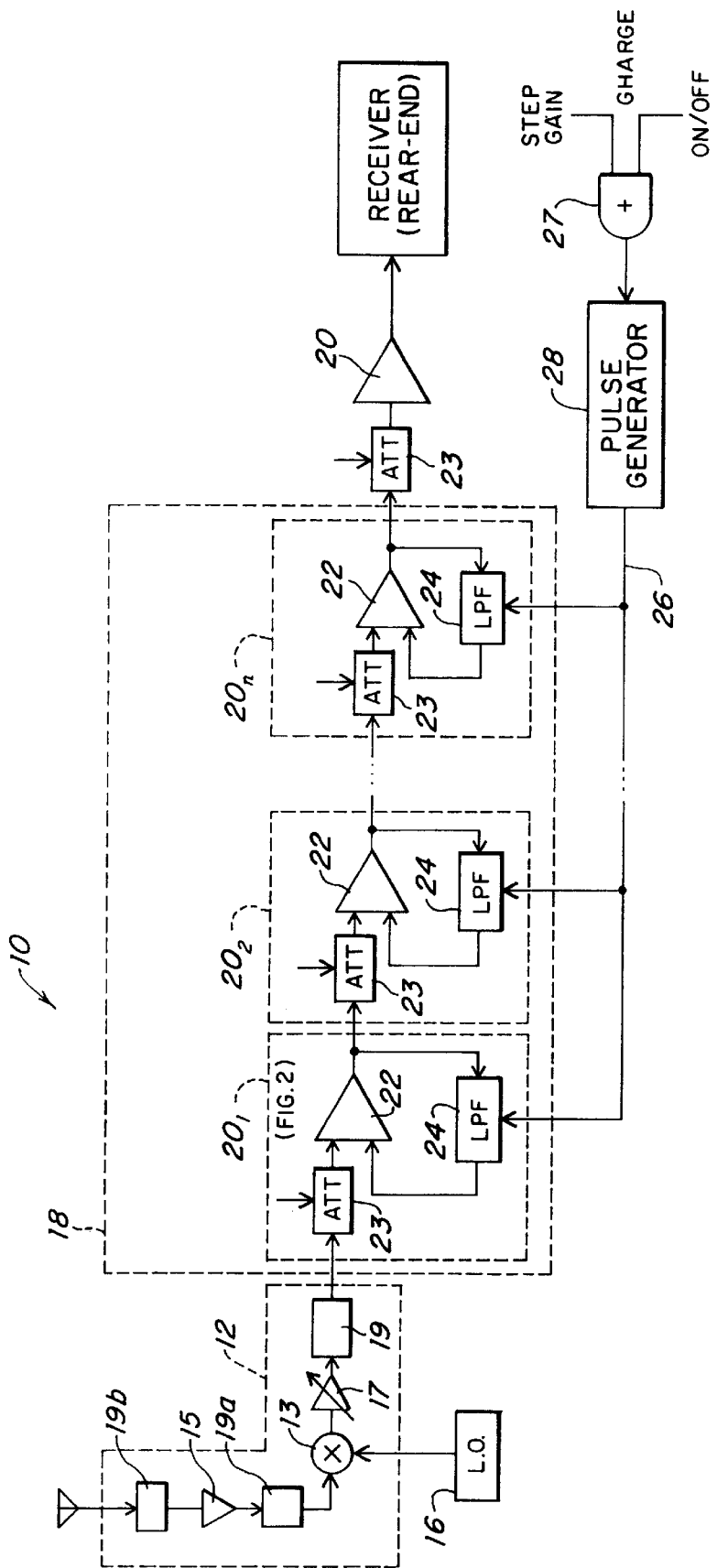
FIG. 1 is a block diagram of a direct conversion receiver according to the invention.

Referring now to FIG. 1, a direct conversion receiver 10 is shown. Such receiver 10 includes a homodyning section 12 (e.g., a mixer 13, low noise amplifier (LNA) 15, variable low noise amplifier (LNA) 17, bandpass filters 19a, 19b and low pass filter 19, as indicated) fed by a radio frequency signal received by antenna 14, having a carrier frequency $f_o$, and a reference signal produced by a local oscillator or frequency synthesizer 16 having the carrier frequency, $f_o$. A high pass filter 18 is coupled to an output of the homodyning section 12 for removing unwanted DC components resulting from the homodyning process prior to subsequent amplification of the baseband signal by amplifier 20. The high pass filter 18 is designed with a sufficiently low cutoff frequency to reject the dc components but not sufficiently impact the information contained in the nearby low frequencies (i.e., the high pass filter 18 is a dc block).

The high filter 18 includes a plurality of, here n, serially coupled high pass filter stages $20_1$ to $20_n$. Each one of the high pass filter stages $20_1$–$20_n$ is identical in construction, an exemplary one thereof, here stage $20_1$, being shown in detail in FIGS. 2 and 3. Suffice it to say here, however, that each one of the stages $20_1$–$20_n$ includes an amplifier 22 and a low pass filter 24 coupled in a negative feedback arrangement with the amplifier 22. Each one of the low pass filters 24 is adapted to have the cutoff frequency thereof switch from an initial high cutoff frequency when the receiver 10 is turned on (during an initial phase of operation as when the amplifiers 22 are turned on or when there is a large step change in the gain of such amplifiers 22) to a subsequent lower, normal operating cutoff frequency a predetermined time after an initial time period, in response to a control signal produced on line 26 in response to a pulse generator 28. The pulse generator 28 is fed via an OR gate 27, to an on/off signal and to a large step gain change signal. The step gain signal indicates that a large step in gain has been commanded to variable attenuators 23 included in the stages $20_1$–$20_n$, as indicated. The function of the control signal on line 26 will be described in more detail below. Suffice it to say here, however, that the pulse generator 28 produces a pulse during the initial time period which is initiated each time the receiver 10 (e.g., amplifiers 22) is turned on or a large step in the gain of amplifiers 17, 22, or amplifier 20 via the variable attenator 23 preceding such amplifier 20.

Figure 2:
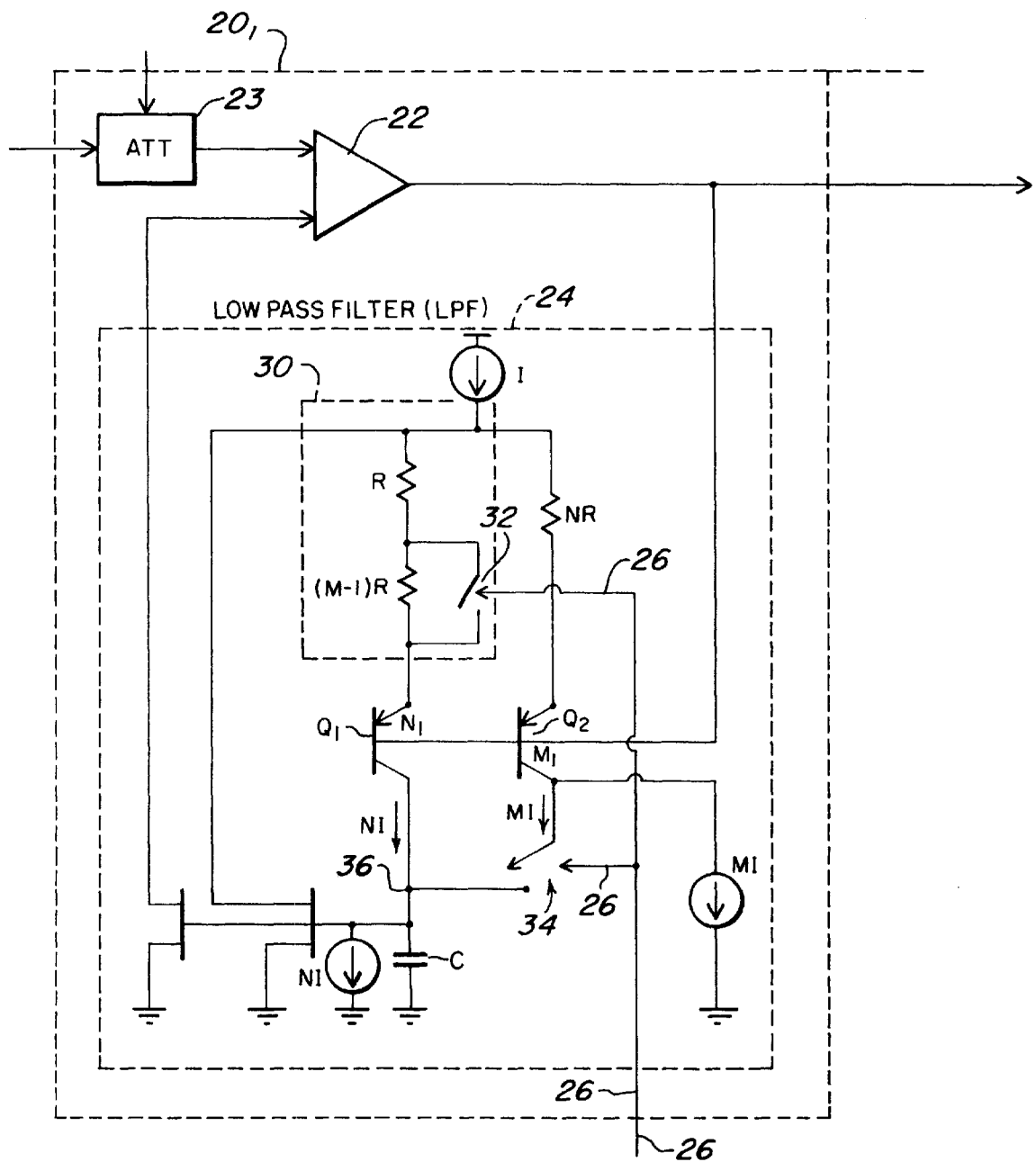
FIG. 2 is a block diagram of a high pass filter stage used in the receiver of FIG. 1.

Further, referring also to FIG. 2, an exemplary one of the high pass filter stages $20_1$–$20_n$ of the direct conversion receiver 10, here filter $20_1$ is shown to include, in the low pass filter 24 thereof: a capacitor, C, and a resistor section 30 having serially connected resistors R and (M+1)R, where M is a positive integer) coupled to a capacitor, C, through transistor $Q_1$. The resistor section 30 includes a switching arrangement 32 for changing the resistance of the resistance section 30 from a first resistance, R, during the initial phase to a second resistance during the subsequent normal operating phase in response to the control signal on line 26. More particularly, the resistance of resistor section 30 has a lower value, R, during the initial phase and a second, higher value, MR, during the subsequent, normal operating phase.

Further, the low pass filter 24 includes a switching arrangement 34 for rapidly charging the capacitor, C, from current source I during the initial phase (i.e., a pre-charge phase) to rapidly place an initial charge the capacitor C prior to the normal operating phase through the resistor R, the resistor (M+1)R being short circuited by the switching arrangement 32. More particularly, the output of the resistor section 30 is coupled to the capacitor C through a pair of transistors $Q_1$, $Q_2$, and the switching arrangement 32, as indicated. The output voltage produced across the capacitor C is fed back to the input of the amplifier 22 in a negative feedback arrangement, as described above.

The emitter area of transistor $Q_1$ is N and the emitter area of transistor $Q_2$ is M. The base of both transistors $Q_1$ and $Q_2$ is coupled to the output of amplifier 22, as shown. During the initial pre-charge phase, and assuming for purposes of illustration that the transistors $Q_1$ and $Q_2$ are in their active region, the switching arrangement 34 will direct both current NI from transistor $Q_1$ and the current MI from transistor $Q_2$ to node 36. Thus, the current used to pre-charge capacitor C will be NI+MI. After the initial phase, the switching arrangement 34 will divert the current MI from node 36 and the current to capacitor C will only be the current NI from transistor $Q_1$. It is noted that a current return path to the current source I is provided by the NI current source connected to node 36 and to the collector electrode of transistor $Q_1$ and a current return path to the current source I is provided by the MI current source connected to the collector electrode of transistor $Q_2$.

In summary, during the initial phase, i.e., for a time duration to enable rapidly pre-charging the capacitor C: (1) the cutoff frequency of the low pass filter 24 is increased because the resistance of resistor section 30 is lower (i.e., R) than during the normal operating phase (i.e., MR) to reduce the time required to charge the capacitor during the pre-charge phase; and (2) the capacitor C is rapidly charged through the lower resistance of the resistor section 30 and through a relatively high current passing from both transistors $Q_1$ and $Q_2$ to node 36 (i.e., the upper electrode of the capacitor C).

Figure 3:
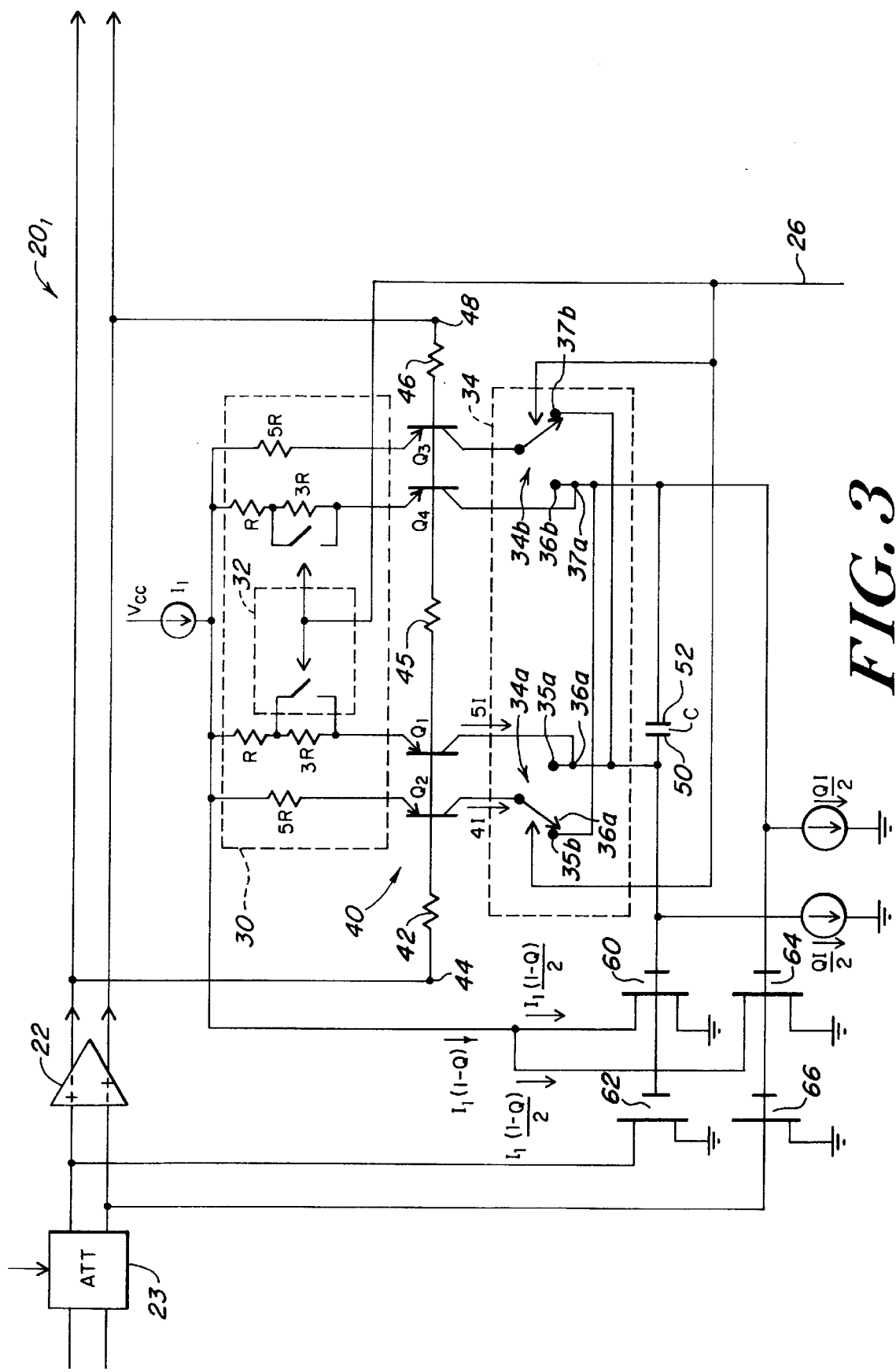
FIG. 3 is a block diagram of the high pass filter stage of FIG. 2 in more detail.

Referring now also to FIG. 3, the high pass filter stage $20_1$ is shown to in more detail. It is first noted that the stage $20_1$ is fed with a differential input from the homodyning section 12 (FIG. 1) and such amplifier 22 produces a differential output. The low pass filter 24 includes a differential amplifier 40 having a first pair of transistors, $Q_1$, $Q_2$ and a second pair of transistors $Q_3$, $Q_4$. Each one of the transistors $Q_1$, $Q_2$, $Q_3$, $Q_4$ is here a bipolar transistor and has a first electrode, here an emitter electrode, a second electrode, here a collector electrode, and a control electrode, here a base electrode. The base electrode is adapted to control a flow of carriers (e.g., current) between the emitter and collector electrodes. The emitter area of transistors $Q_1$ and $Q_4$ are each N, here 5, and the emitter area of transistors $Q_2$ and $Q_3$ are each M, here 4.

The base electrodes of the first pair of transistors $Q_1$, $Q_2$ is coupled through resistor 42 to provide a first input 44 for the differential amplifier 40 which is connected to the inverting (−) output of amplifier 22, and the base electrodes of the second pair of transistors $Q_3$, $Q_4$ is coupled through resistor 46 to provide a second input 48 for the differential amplifier 40, which is connected to the non-inverting (+) output of amplifier 22. The base electrodes of transistors $Q_1$ and $Q_2$ are connected to the base electrodes of transistors $Q_3$ and $Q_4$ through a resistor 45, as indicated.

The current source, $I_1$, is coupled between voltage source Vcc and the emitter electrodes of the first and second pair of transistors $Q_1$, $Q_2$, $Q_3$ and $Q_4$ through the resistor section 30, as indicated. Here, the resistor section 30 has: (1) two serially connected resistors R and 3R; the left pair being coupled between the current source $I_1$ and the emitter electrode of transistor $Q_1$ and the right pair being coupled between the current source $I_1$ and the emitter electrode of transistor $Q_4$; and, (2) two single resistors 5R; the left one being connected between the current source $I_1$ and the emitter electrode of transistor $Q_2$ and the right one being connected between the current source $I_1$ and the emitter electrode of transistor $Q_3$. The switching arrangement 32 includes a pair of switches, the left one being connected to short out, in response to the control signal on line 26, the left resistor 3R during the initial phase of operation and the right one being connected to short out, in response to the same control signal on line 26, the right resistor 3R during the initial phase of operation. During the subsequent normal operating phase, both switches are open in response to the control signal on line 26. Thus, as noted above in connection with FIG. 2, during the initial phase, the resistance between the current source $I_1$ and the emitter electrode of transistor $Q_1$ is R while during the normal operating mode the resistance between the current source $I_1$ and the emitter electrode of transistor $Q_1$ is R+3R, i.e., a resistance four times larger than the resistance during the initial phase. Likewise, during the initial phase, the resistance between the current source $I_1$ and the emitter electrode of transistor $Q_3$ is R while during the normal operating mode the resistance between the current source $I_1$ and the emitter electrode of transistor $Q_3$ is R+3R, i.e., a resistance four times larger than the resistance during the initial phase.

The capacitor, C, has a first electrode 50 coupled to the collector electrode of transistor $Q_1$ at node 36a and a second electrode 52 coupled to the collector electrode of transistor $Q_4$ at node 36b. The switching arrangement 34 includes a pair of switches 34a, 34b. Switch 34a has an input coupled to the collector electrode of transistor $Q_2$ and switch 34b has an input coupled to the collector electrode of transistor $Q_4$. One of a pair of outputs of switch 34a, i.e., output 35a, is connected, at node 36a, to electrode 50 of capacitor C and the other output, i.e., output 35b, is connected to electrode 52 of capacitor C. One of the pair of outputs of switch 34b, i.e., output 37a, is connected, at node 36b, to electrode 52 of capacitor C and the other output, i.e., output 37b, is connected to electrode 50 of capacitor C, as shown.

Switch 34a is adapted to couple the collector electrode of transistor $Q_2$ to either electrode 50 of the capacitor C (i.e. to output 35a), during the initial charging phase, or to the electrode 52 of the capacitor C (i.e., to output 35b) during the subsequent, normal operating phase in response to the control signal on line 26. Switch 34b is adapted to couple the collector electrode of transistor $Q_3$ to either the electrode 52 of the capacitor C (i.e., to output 37a), during the initial charging phase, or to the electrode 50 of the capacitor C (i.e., to output 37b) during the subsequent, normal operating phase in response to the control signal on line 26.

The potential on electrode 50 of the capacitor C is coupled to the non-inverting (+) input of amplifier 22 through FET 62 and the potential on electrode 52 of the capacitor C is coupled to the inverting (−) input of amplifier 22 through FET 66, as shown. The FETs 60, 64 are used to provide dc feedback and current replication to FETs 62 and 66. Thus, during the initial operating phase, and assuming that the transistors $Q_1$, $Q_2$, $Q_3$, and $Q_4$ are in their active operating regions, the total current into node 36a will be $QI_1/2$. Likewise, the current into node 36b will also be $QI_1/2$. These currents are set by the current sources connected to ground at nodes 50, 52 of capacitor C, as indicated. The DC current through FETs 60, 64 is therefore constrained to be $(1-Q)I_1/2$ by the aforementioned feedback mechanism. Furthermore, current replication in FETs 63, 66 constrains the nominal operating current of these FETs to be equal to the DC current through FETs 60, 64, respectively. The gain of the amplifier is directly related to the transconductance of transistors $Q_1$, $Q_2$, $Q_3$, and $Q_4$. This transconductance is related to the current flowing in each of the transistors. The current flowing in transistors $Q_1$ and $Q_4$ is proportional to $\{N/[M+N]\}\{QI_1/2\}$, where N is here 5 and M is here 4. Likewise, the current flowing in transistors $Q_1$ and $Q_4$ is proportional to $\{M/(M+N)\}\{QI_1/2\}$. Thus, in the initial phase of operation, the transconductance is related to the sum of the currents in $Q_1$, $Q_2$, $Q_3$ and $Q_4$, or, more simply, related to $QI_1/2$.

However, during the normal operating phase of the circuit, the switching arrangement 34, reverses the polarity of the currents flowing in the transistors $Q_2$, $Q_3$. Thus, in the normal operating phase of the circuit, the transconductance is related to the difference of the currents flowing in transistors $Q_1$, $Q_4$ minus the current flowing in transistors $Q_2$, $Q_3$, or more simply, $\{[N-M]/[N+M]\}\{QI_1/2\}$. The net change in transconductance from the initial phase to the normal operating phase is, therefore, [N−M]/[N+M]. Thus, there is a larger current which charges the capacitor, C, during the initial phase than during the subsequent normal operating phase.

These and other embodiments are within the spirit and scope of the appended claims.

What is claimed is:

1. A filter, comprising:
   a first high pass filter stage; and
   a second high pass filter stage, said second high pass filter stage being serially coupled to said first high pass filter stage to maintain a low cut-off frequency;
   said first high pass filter including,
      an amplifier, and
      a low pass filter coupled in a negative feedback arrangement with said amplifier, said low pass filter switching a cutoff frequency thereof from an initial high cutoff frequency to a subsequent lower cutoff frequency; said second high pass filter including,
      an amplifier, and
      a low pass filter coupled in a negative feedback arrangement with said amplifier, said low pass filter switching a cutoff frequency thereof from an initial high cutoff frequency to a subsequent lower cutoff frequency.

2. A high pass filter, comprising:
   an amplifier; and
   a low pass filter coupled in a negative feedback arrangement with said amplifier;
   said low pass filter having,
      a capacitor,
      a resistor section coupled to said capacitor, and
      a switch for changing a resistance of said resistor section, said resistance having a first resistance value during a pre-charge phase and a second resistance value during a subsequent phase.

3. A filter, comprising:
   a first high pass filter stage; and
   a second high pass filter stage, said second high pass filter stage being serially coupled to said first high pass filter stage to maintain a low cut-off frequency;
   said first high pass filter including,
      an amplifier, and
      a low pass filter coupled in a negative feedback arrangement with said amplifier,
      said low pass filter having,
         a capacitor,
         a resistor section coupled to said capacitor, and
         a switch for changing a resistance of said resistor section, said resistance having a first resistance value during a pre-charge phase and a second resistance value during a subsequent phase;
   said second high pass filter including,
      an amplifier, and
      a low pass filter coupled in a negative feedback arrangement with said amplifier,
      said low pass filter having,
         a capacitor,
         a resistor section coupled to said capacitor, and a switch for changing a resistance of said resistor section, said resistance having a first resistance value during a pre-charge phase and a second resistance value during a subsequent phase.

4. A high pass filter, comprising:
an amplifier; and
a low pass filter coupled in a negative feedback arrangement with said amplifier;
said low pass filter having,
a capacitor, and
a switching section for charging said capacitor during a pre-charge phase.

5. A filter, comprising:
a first high pass filter stage; and
a second high pass filter stage, said second high pass filter stage being serially coupled to said first high pass filter stage to maintain a low cut-off frequency;
said first high pass filter including,
an amplifier, and
a low pass filter coupled in a negative feedback arrangement with said amplifier,
said low pass filter having,
a capacitor, and
a switching section for charging said capacitor during a pre-charge phase; said second high pass filter including,
an amplifier, and
a low pass filter coupled in a negative feedback arrangement with said amplifier,
said low pass filter having,
a capacitor, and
a switching section for charging said capacitor during a pre-charge phase.

6. A high pass filter, comprising:
an amplifier; and
a low pass filter coupled in a negative feedback arrangement with said amplifier,
said low pass filter having,
a capacitor, and
a switchable capacitor charging circuit, responsive to a control signal, for charging said capacitor with a charging current from a current source during an initial charging phase and for de-coupling said capacitor from the current source during a subsequent normal operating phase.

7. A filter, comprising:
a first high pass filter stage; and
a second high pass filter stage, said second high pass filter stage being serially coupled to said first high pass filter stage to maintain a low cut-off frequency;
said first high pass filter including,
an amplifier, and
a low pass filter coupled in a negative feedback arrangement with said amplifier,
said low pass filter having,
a capacitor, and
a switchable capacitor charging circuit, responsive to a control signal, for charging said capacitor with a charging current from a current source during an initial charging phase and for de-coupling said capacitor from the charging current during a subsequent normal operating phase;
said second high pass filter including,
an amplifier, and
a low pass filter coupled in a negative feedback arrangement with said amplifier,
said low pass filter having,
a capacitor, and
a switchable capacitor charging circuit, responsive to a control signal, for charging said capacitor with a charging current from a current source during an initial charging phase and for de-coupling said capacitor from the charging current during a subsequent normal operating phase.

8. A low pass filter, comprising:
a differential amplifier having a first pair of transistors and a second pair of transistors, each transistor having a first electrode, a second electrode and a control electrode;
said control electrodes controlling a flow of carriers between the first and second electrodes;
said control electrodes of said first pair of transistors providing a first input for said differential amplifier;
said control electrodes of said second pair of transistors providing a second input for said differential amplifier;
a current source coupled to said first electrodes of said first and second pairs of transistors;
a capacitor, a first electrode of said capacitor being coupled to the second electrode of a first transistor in said first pair of transistors and a second electrode of said capacitor being coupled to the second electrode of a first transistor in said second pair of transistors; and
a pair of switches;
said pair of switches including,
a first switch coupled the second electrode of a second transistor in said first pair of transistors to said first electrode of said capacitor, during an initial charging phase, and to said second electrode of said capacitor during a subsequent phase, and
a second switch coupled the second electrode of a second transistor in said second pair of transistors to said second electrode of said capacitor, during the initial charging phase, and to said first electrode of said capacitor during the subsequent phase.

9. The low pass filter as recited in claim 8, wherein said first and second transistors in first and second pairs of transistors pass current from said current source through said first and second electrodes thereof with different current levels.

10. The low pass filter as recited in claim 9, including a resistance between said current source and said first electrode of said first transistor in said first pair of transistors and a second resistance between said current source and said first electrode of said first transistor in said second pair of transistors.

11. The low pass filter as recited in claim 10, including an additional switch for changing a resistance value of said first and second resistances when the filter changes from the initial charging phase to the subsequent phase.

12. The low pass filter as recited in claim 10, wherein said additional switch changes the resistance value of the first and second resistances from a lower value to a higher value when the filter changes from the initial charging phase to the subsequent phase.

13. A direct conversion receiver, comprising:
a homodyning section fed by a received radio frequency signal having a carrier frequency and a reference signal having the carrier frequency; and
a filter coupled to an output of said homodyning section;
said filter including,
a first high pass filter stage; and a second high pass filter stage, said second high pass filter stage being serially coupled to said first high pass filter stage to maintain a low cut-off frequency;
said first high pass filter including,
an amplifier, and
a low pass filter coupled in a negative feedback arrangement with said amplifier, said low pass filter switching a cutoff frequency thereof from an initial high cutoff frequency to a subsequent lower cutoff frequency;
said second high pass filter including,
an amplifier, and
a low pass filter coupled in a negative feedback arrangement with said amplifier, said low pass filter switching a cutoff frequency thereof from an initial high cutoff frequency to a subsequent lower cutoff frequency.

14. A direct conversion receiver, comprising:
a homodyning section fed by a received radio frequency signal having a carrier frequency and a reference signal having the carrier frequency; and
a filter coupled to an output of said homodyning section;
said filter including,
a first high pass filter stage; and
a second high pass filter stage, said second high pass filter stage being serially coupled to said first high pass filter stage to maintain a low cut-off frequency;
said first high pass filter including,
an amplifier, and
a low pass filter coupled in a negative feedback arrangement with said amplifier,
said low pass filter having,
a capacitor,
a resistor section coupled to said capacitor, and
a switch for changing a resistance of said resistor section, said resistance having a first resistance value during a pre-charge phase and a second resistance value during a subsequent phase;
said second high pass filter including,
an amplifier, and
a low pass filter coupled in a negative feedback arrangement with said amplifier,
said low pass filter having,
a capacitor,
a resistor section coupled to said capacitor, and
a switch for changing a resistance of said resistor section, said resistance having a first resistance value during a pre-charge phase and a second resistance value during a subsequent phase.

15. A direct conversion receiver, comprising:
a homodyning section fed by a received radio frequency signal having a carrier frequency and a reference signal having the carrier frequency; and
a filter coupled to an output of said homodyning section;
said filter including,
a first high pass filter stage; and
a second high pass filter stage, said second high pass filter stage being serially coupled to said first high pass filter stage to maintain a low cut-off frequency;
said first high pass filter including,
an amplifier, and
a low pass filter coupled in a negative feedback arrangement with said amplifier,
said low pass filter having,
a capacitor, and
a switching section for charging said capacitor during a pre-charge phase;
said second high pass filter including,
an amplifier, and
a low pass filter coupled in a negative feedback arrangement with said amplifier,
said low pass filter having,
a capacitor, and
a switching section for charging said capacitor during a pre-charge phase.

16. A direct conversion receiver, comprising:
a homodyning section fed by a received radio frequency signal having a carrier frequency and a reference signal having the carrier frequency; and
a filter coupled to an output of said homodyning section;
said filter including,
a differential amplifier having a first pair of transistors and a second pair of transistors, each transistor having a first electrode, a second electrode and a control electrode,
said control electrodes controlling a flow of carriers between the first and second electrodes,
said control electrodes of said first pair of transistors providing a first input for said differential amplifier,
said control electrodes of said second pair of transistors providing a second input for said differential amplifier,
a current source coupled to said first electrodes of said first and second pairs of transistors,
a capacitor, a first electrode of said capacitor being coupled to the second electrode of a first transistor in said first pair of transistors and a second electrode of said capacitor being coupled to the second electrode of a first transistor in said second pair of transistors, and
a pair of switches;
said pair of switches including,
a first switch coupled the second electrode of a second transistor in said first pair of transistors to said first electrode of said capacitor, during an initial charging phase, and to said second electrode of said capacitor during a subsequent phase, and
a second switch coupled the second electrode of a second transistor in said second pair of transistors to said second electrode of said capacitor, during the initial charging phase, and to said first electrode of said capacitor during the subsequent phase.

17. The direct conversion receiver as recited in claim 16, wherein said first and second transistors in first and second pairs of transistors pass current from said current source through said first and second electrodes thereof with different current levels.

18. The direct conversion receiver as recited in claim 17, including a resistance between said current source and said first electrode of said first transistor in said first pair of transistors and a second resistance between said current source and said first electrode of said first transistor in said second pair of transistors.

19. The direct conversion receiver as recited in claim 17, including an additional switch for changing a resistance value of said first and second resistances when the filter changes from the initial charging phase to the subsequent phase.

20. The direct conversion receiver as recited in claim 19, wherein said additional switch changes the resistance value of the first and second resistances from a lower value to a higher value when the filter changes from the initial charging phase to the subsequent phase.

21. A direct conversion receiver, comprising:
a homodyning section fed by a received radio frequency signal having a carrier frequency and a reference signal having the carrier frequency; and
a filter coupled to an output of said homodyning section;
said filter including,
- an amplifier, and
- a low pass filter coupled in a negative feedback arrangement with said amplifier, said low pass filter switching a cutoff frequency thereof from an initial high cutoff frequency to a subsequent lower cutoff frequency.

22. A direct conversion receiver, comprising:
a homodyning section fed by a received radio frequency signal having a carrier frequency and a reference signal having the carrier frequency; and
a filter coupled to an output of said homodyning section;
said filter including,
- an amplifier, and
- a low pass filter coupled in a negative feedback arrangement with said amplifier,
said low pass filter having,
- a capacitor,
- a resistor section coupled to said capacitor, and
- a switch for changing a resistance of said resistor section, said resistance having a first resistance value during a pre-charge phase and a second resistance value during a subsequent phase.

23. A direct conversion receiver, comprising:
a homodyning section fed by a received radio frequency signal having a carrier frequency and a reference signal having the carrier frequency; and
a filter coupled to an output of said homodyning section;
said filter including,
- an amplifier, and
- a low pass filter coupled in a negative feedback arrangement with said amplifier,
said low pass filter having,
- a capacitor, and
- a switching section for charging said capacitor during a pre-charge phase.

* * * * *